(12) United States Patent
Cui (10) Patent No.: US 10,486,419 B2
(45) Date of Patent: Nov. 26, 2019

(54) METHOD FOR ADJUSTING AN INKJET PRINTING APPARATUS, INKJET PRINTING METHOD AND APPARATUS, AND SYSTEM INCLUDING THE SAME

(71) Applicant: BOE Technology Group Co., Ltd., Beijing (CN)

(72) Inventor: Ying Cui, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/823,433

(22) Filed: Nov. 27, 2017

(65) Prior Publication Data

US 2018/0311952 A1   Nov. 1, 2018

(30) Foreign Application Priority Data

Apr. 28, 2017  (CN) .......................... 2017 1 0295985

(51) Int. Cl.
*B41J 2/045*     (2006.01)
*G06K 15/10*    (2006.01)
(Continued)

(52) U.S. Cl.
CPC ......... *B41J 2/04501* (2013.01); *B41J 2/0456* (2013.01); *B41J 2/04558* (2013.01);
(Continued)

(58) Field of Classification Search
CPC .. B41J 2/0456; B41J 2/04581; B41J 2/04588; B41J 2/195; B41J 2/2135; B41J 2/5056; B41J 2202/09
See application file for complete search history.

(56) References Cited

U.S. PATENT DOCUMENTS 5,404,020 A * 4/1995 Cobbs .................... B41J 2/2135
                                                         250/548
6,003,980 A * 12/1999 Sheinman .................. B41J 2/12
                                                         347/19
(Continued)

FOREIGN PATENT DOCUMENTS

CN       1243069 A      2/2000
CN       1388917 A      1/2003
(Continued)

OTHER PUBLICATIONS

Office Action for Chinese Appl. No. 201710295985.9, dated Mar. 5, 2018.

*Primary Examiner* — John Zimmermann
(74) *Attorney, Agent, or Firm* — Arent Fox LLP; Michael Fainberg (57) ABSTRACT

A method for adjusting an inkjet printing apparatus, an inkjet printing method, an inkjet printing apparatus, and a system including the same. The inkjet printing apparatus includes a plurality of nozzles, and the method for adjusting the inkjet printing apparatus includes: obtaining images of liquid drops which are output respectively from the plurality of nozzles during an inkjet printing process after the liquid drops are dried; and adjusting a driving parameter of at least one nozzle of the plurality of nozzles based upon the images of the liquid drops which are output respectively from the plurality of nozzles after the liquid drops are dried, so that volumes of the liquid drops which are output respectively from the plurality of nozzles are substantially same.

15 Claims, 7 Drawing Sheets

(51) Int. Cl.
*H01L 51/00* (2006.01)
*B41J 3/28* (2006.01)

(52) U.S. Cl.
CPC ....... *B41J 2/04581* (2013.01); *B41J 2/04588* (2013.01); *B41J 3/28* (2013.01); *G06K 15/102* (2013.01); *H01L 51/0005* (2013.01)

(56) References Cited

U.S. PATENT DOCUMENTS

| | | |
|---|---|---|
| 6,247,788 B1 | 6/2001 | Kamei |
| 6,347,857 B1 * | 2/2002 | Purcell ................. B41J 2/16579 347/19 |
| 9,010,899 B2 * | 4/2015 | Harjee ................ H01L 51/0005 347/14 |
| 9,832,428 B2 * | 11/2017 | Hauf ........................ H04N 7/18 |
| 2002/0054197 A1 | 5/2002 | Okada et al. |
| 2004/0012857 A1 | 1/2004 | Uchiyama et al. |
| 2004/0170762 A1 * | 9/2004 | Newsome ................ B41J 11/46 427/256 |
| 2006/0055714 A1 | 3/2006 | Kuwahara et al. |
| 2007/0109606 A1 | 5/2007 | Nagae |
| 2008/0278534 A1 | 11/2008 | Kim et al. |
| 2009/0096823 A1 * | 4/2009 | Watt ..................... B41J 2/17593 347/10 |
| 2017/0050435 A1 | 2/2017 | Zhao |
| 2017/0157922 A1 | 6/2017 | Zhao |

FOREIGN PATENT DOCUMENTS

| | | |
|---|---|---|
| CN | 1400927 A | 3/2003 |
| CN | 1700988 A | 11/2005 |
| CN | 101301814 A | 11/2008 |
| CN | 104985933 A | 10/2015 |
| CN | 105082762 A | 11/2015 |

\* cited by examiner

METHOD FOR ADJUSTING AN INKJET PRINTING APPARATUS, INKJET PRINTING METHOD AND APPARATUS, AND SYSTEM INCLUDING THE SAME

CROSS-REFERENCE TO RELATED APPLICATION

This Application claims priority to Chinese Patent Application No. 201710295985.9, filed on Apr. 28, 2017, the content of which is incorporated by reference in the entirety.

TECHNICAL FIELD

Embodiments of the present disclosure relate to the field of inkjet printing technologies and particularly to a method for adjusting an inkjet printing apparatus, and an inkjet printing method and apparatus, and a system including the same.

DESCRIPTION OF THE RELATED ART

Of various film formation technologies, the solution film formation technology has gained more and more attention. As the solution film formation refers, a desired material is processed, for example, dispersed, into micro particles at a nanometer order, and then dissolved in a corresponding solvent, and the solution is further deposited on a surface of a substrate using another device; and after the solvent is vaporized, a desired thin film is formed on the surface of the substrate.

Inkjet printing (IJP) is an important solution film formation technology with an easy operation, a low cost, a simple process, applicability to a large scale production, and other advantages, so it has been widely applied with a good effect in various fields of manufacturing an Organic Light Emitting Diode (OLED), an organic thin film transistor, a metal electrode, etc.

In the related art, an organic light emitting display can be produced by forming a pixel image using the inkjet printing technology, where ink is jetted into a pixel definition layer, and then dried, thus resulting in a corresponding pixel image. During this process, it is desired for a producer to jet ink liquid drops uniformly into respective pixel openings to thereby improve the evenness of a film to be formed between the pixels. However during a real production process, when the ink in the pixel definition layer becomes dry, a mura (representing unevenness in Japanese, and commonly used in the field of liquid crystal display technologies) ring tends to be observed, where the mura ring arises from a difference between a dry atmosphere around a pixel, and an atmosphere in the middle of the pixel; and since liquid drops with different volumes are jetted out of different nozzles, there are different mura rings generated in the respective pixels, so that the film is formed unevenly between the pixels, thus degrading the display quality of the display.

SUMMARY

In one aspect, an embodiment of the present disclosure provides a method for adjusting an inkjet printing apparatus including a plurality of nozzles, the method including: obtaining images of liquid drops which are output respectively from the plurality of nozzles during an inkjet printing process after the liquid drops are dried; and adjusting a driving parameter of at least one nozzle of the plurality of nozzles based upon the images of the liquid drops which are output respectively from the plurality of nozzles after the liquid drops are dried, so that volumes of the liquid drops which are output respectively from the plurality of nozzles are substantially same.

In another aspect, an embodiment of the present disclosure further provides an inkjet printing method including: adjusting an inkjet printing apparatus using the method for adjusting an inkjet printing apparatus according to the embodiment above of the present disclosure, and performing inkjet printing using the inkjet printing apparatus.

In still another aspect, an embodiment of the present disclosure further provides an inkjet printing apparatus including: a plurality of nozzles; and a controller configured to obtain images of liquid drops which are output respectively from the plurality of nozzles during an inkjet printing process after the liquid drops are dried; and to adjust a driving parameter of at least one nozzle of the plurality of nozzles based upon the images of the liquid drops which are output respectively from the plurality of nozzles after the liquid drops are dried, so that volumes of the liquid drops which are output respectively from the plurality of nozzles are substantially same.

In still another aspect, an embodiment of the present disclosure further provides an inkjet printing system including: the inkjet printing apparatus according to the embodiment above of the present disclosure; and an automatic optical inspection apparatus configured to detect the images of the liquid drops which are output respectively from the plurality of nozzles of the inkjet printing apparatus after the liquid drops are dried.

In still another aspect, an embodiment of the present disclosure further provides a method for manufacturing a display substrate, the method including: forming a pixel image on a base substrate using the inkjet printing method according to the embodiment above of the present disclosure.

BRIEF DESCRIPTION OF THE DRAWINGS

In order to make the technical solutions according to the embodiments of the disclosure more apparent, the drawings in the embodiments of the disclosure will be described below in brief, and apparently the drawings to be described below illustrate only some of the embodiments of the disclosure, but not intended to limit the disclosure thereto.

DETAILED DESCRIPTION OF THE EMBODIMENTS

In order to make the objects, technical solutions, and advantages of the embodiments of the disclosure more apparent, the technical solutions according to the embodiments of the disclosure will be described below clearly and fully with reference to the drawings in the embodiments of the disclosure. Apparently the embodiments to be described are only a part but not all of the embodiments of the disclosure. Based upon the embodiments of the disclosure described here, all the other embodiments which can occur to those ordinarily skilled in the art without any inventive effort shall come into the scope of the disclosure as claimed.

Unless defined otherwise, scientific or technologic terms as referred to in this disclosure shall convey usual meaning as interpreted by those ordinarily skilled in the art. "Include", "contain", or other similar words as referred to in this disclosure mean that an element or an item preceding the word encompasses elements or items listed following the word, and their equivalents, but does not preclude other elements or items. "Above", "below", "left", "right", etc., as referred to in this disclosure are only intended to represent a relative positional relationship, and after the absolute position of an object in question is changed, the relative position relationship may also be changed accordingly.

In an inkjet printing process, solution of one picoliter ($10^{-7}$ liter) to tens of picoliter can be jetted onto a specific object at a frequency of more than hundreds of times per second, and then the solvent can be removed, thus resulting in a dry thin film. For example, a diameter of a liquid drop can range from 15 μm to 150 μm.

For example, in a process of manufacturing an organic light emitting diode display through inkjet printing, the most important two factors to affect the quality of a screen are the morphology of the dry thin film, and the uniformity of the thickness thereof. Factors affecting the morphology of the thin film include the attribute and the structure of a material of the pixel definition layer, an interface processing process, an ink characteristic, a drying process, etc.; and the uniformity of the thickness of the thin film is generally determined by controlling the uniformity of the volumes of liquid drops from different nozzles. In order to control precisely the volumes of the liquid drops, on one hand, the machining precision of the nozzles can be improved so that a deviation of the machining precision of all the nozzles lies in some range, and on the other hand, a voltage waveform can be further adjusted to calibrate the volume of ink jetted out of each nozzle so that a deviation of the volume lies in some range.

Inkjet heads are generally categorized into piezoelectric, electrostatic, thermally foamed, ultrasonic, etc., and the piezoelectric inkjet head is widely applied in the related art. There is a corresponding driving method for each type of inkjet head, and there are corresponding driving parameters to adjust an inkjet speed, the size of a liquid drop, etc.

Figure 1:
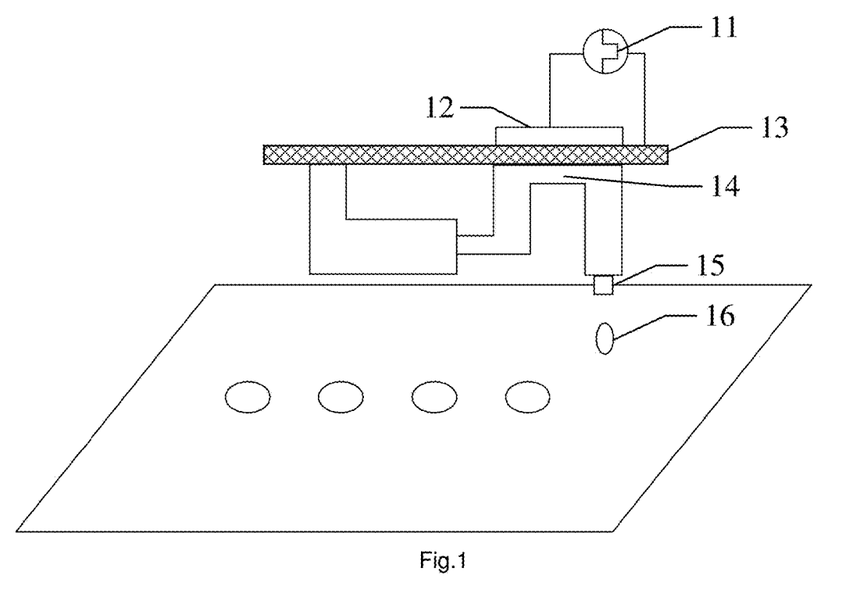
FIG. 1 is a schematic structural diagram of a nozzle in a piezoelectric inkjet printing apparatus.

FIG. 1 illustrates a schematic internal structural diagram of a nozzle in a piezoelectric inkjet printing apparatus. A piezoelectric element 12 (e.g., made of a piezoelectric ceramic material) is arranged on a vibrating plate 13 (which is also a membrane) in the form of a horizontal sheet, and electrodes (not illustrated) are deposited on upper and lower sides of the piezoelectric element 12, so that the direction of an electric field applied via them is parallel to the polarization direction of the piezoelectric element 12. When drive voltage 11 is applied across the electrodes, the piezoelectric element 12 is bent, so that the vibrating plate 13 is bent towards the inside of a pressure cavity 14 to push ink out of the pressure cavity 14. After the drive voltage 11 is removed, the vibrating plate 13 is restored to its original state, so that the pressure cavity 14 is expanded, and the ink goes back, and thus is cut off, thus jetting a liquid drop 16 out of a nozzle. Each inkjet printing apparatus typically includes a plurality of (e.g., 128 or 256, etc.) nozzles 15 arranged at a constant interval, and at least one cavity wall of each nozzle 15 is covered with the piezoelectric element 12, so as to make the nozzle to take in the ink and to jet the ink. Since the piezoelectric element 12 is deformed in proportion to the drive voltage 11, the size of an ink drop, a jet speed, etc., can be easily varied by controlling the waveform of the drive voltage. Alike, corresponding driving parameters of other types of nozzles can also be adjusted to vary the size of an ink drop, etc. The following description will be given taking a piezoelectric nozzle as an example.

Figure 2:
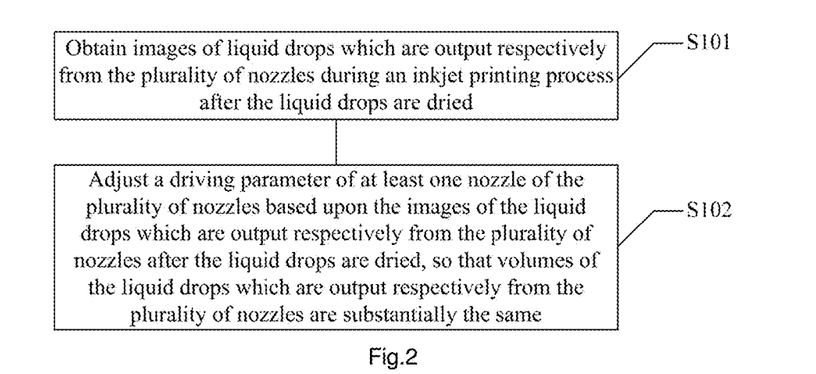
FIG. 2 is a schematic flow chart of a method for adjusting an inkjet printing apparatus according to an embodiment of the disclosure.

An embodiment of the disclosure provides a method for adjusting an inkjet printing apparatus including a plurality of nozzles, for example, arranged in parallel in one or more rows, and as illustrated in FIG. 2 which is a flow chart of the method, the method includes the followings operations.

The operation S101 is to obtain images of liquid drops which are output respectively from the plurality of nozzles during an inkjet printing process after the liquid drops are dried.

The operation S102 is to adjust a driving parameter of at least one nozzle of the plurality of nozzles based upon the images of the liquid drops which are output respectively from the plurality of nozzles after the liquid drops are dried, so that volumes of the liquid drops which are output respectively from the plurality of nozzles are substantially the same.

Wherein, volumes of the liquid drops are substantially the same (i.e. basically the same) refers to that volumes of the liquid drops are the same, or their difference lies in a range acceptable in the industry, for example, their difference is less than 10% of a reference volume, or less than 5% of a reference volume, etc.

An embodiment of the disclosure further provides an inkjet printing apparatus including a plurality of nozzles, and a controller configured to obtain images of liquid drops which are output respectively from the plurality of nozzles during an inkjet printing process after the liquid drops are dried; and to adjust a driving parameter of at least one nozzle of the plurality of nozzles based upon the images of the liquid drops which are output respectively from the plurality of nozzles after the liquid drops are dried, so that volumes of the liquid drops which are output respectively from the plurality of nozzles are substantially same.

An embodiment of the disclosure further provides an inkjet printing system including the inkjet printing apparatus above, and an automatic optical inspection apparatus configured to detect the images of the liquid drops which are output respectively from the plurality of nozzles of the inkjet printing apparatus after the liquid drops are dried.

An embodiment of the disclosure further provides an inkjet printing method including: adjusting an inkjet printing apparatus using the method above for adjusting an inkjet printing apparatus, and performing inkjet printing using the inkjet printing apparatus.

An embodiment of the disclosure further provides a method for manufacturing a display substrate, the method including: forming a pixel image on a base substrate using the inkjet printing method above. In some embodiments, the display substrate is a color filter substrate or an organic light emitting diode display substrate.

Figure 3:
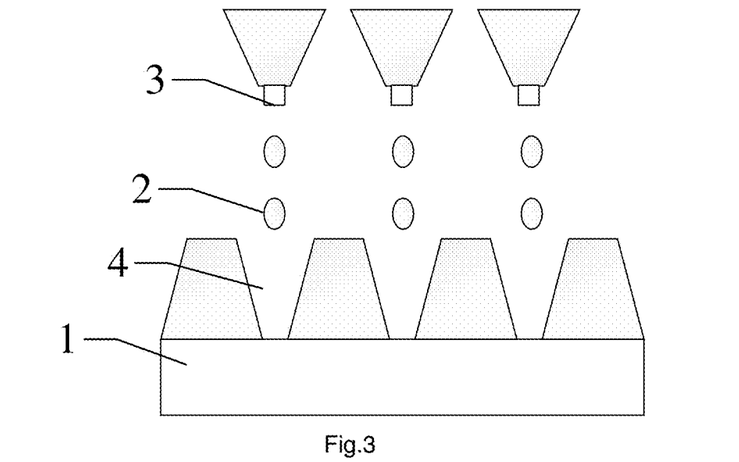
FIG. 3 is a schematic flow chart of inkjet printing.

Taking the technology of manufacturing an OLED display substrate known by the applicant as an example, desired liquid with some volume is printed at a pixel definition layer (which is fabricated on the substrate prior to inkjet printing to make the inkjet liquid drops injected precisely into a specified pixel area) through inkjet printing, and dried into a pixel image. As illustrated in FIG. 3, the display substrate 1 is an organic light emitting diode display substrate, and at this time, the liquid which is output from nozzles of an inkjet printing apparatus is a material for forming an organic functional layer of an organic light emitting diode. During the fabrication process, the liquid drops 2 which are output from the respective nozzles 3 of the inkjet printing apparatus are dropped into respective identical pixel definition areas 4 formed at the pixel definition layer on the display substrate 1, and thereafter dried into pixel images.

Figure 4:
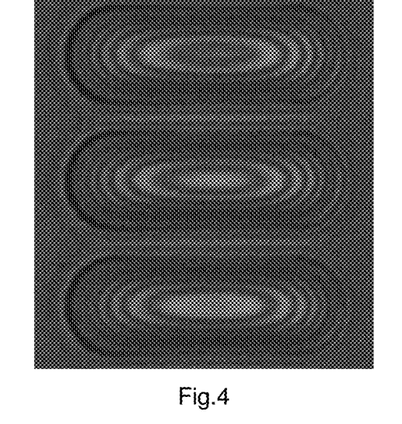
FIG. 4 is a schematic diagram of an image of mura rings.

During production, it is desired for a producer to jet the ink liquid drops uniformly into pixel openings of the respective pixel definition areas to thereby improve the uniformity of a film to be formed between the pixels. However in the real production, when the ink in the respective pixel definition areas is dried, mura rings tend to be observed, and if the volumes of the liquid drops jetted out of the different nozzles are different, then different numbers of mura rings with different sizes will be generated after these liquid drops are dried. As illustrated in FIG. 4, the numbers of mura rings, and the sizes of the rings tend to be significantly different from each other, showing that the film to be formed across the pixels is not uniform, which may degrade the display quality of the display.

In order to manufacture the display with a high display quality, the uniform film shall be formed for the pixel images formed in the respective pixel definition areas 4 using the liquid drops 2 output from the respective nozzles 3 of the inkjet printing apparatus, so that the pixel images are substantially the same. To this end, the inkjet printing apparatus needs to be debugged prior to inkjet printing so that the volumes of the liquid drops jetted out of the respective nozzles of the inkjet printing apparatus are substantially the same.

An embodiment of the disclosure provides a method for adjusting an inkjet printing apparatus including a plurality of nozzles, for example, arranged in parallel in one or more rows, for example, which are piezoelectric nozzles. As illustrated in the flow chart of FIG. 5, the method includes the following operations S201 to S203.

Figure 5:
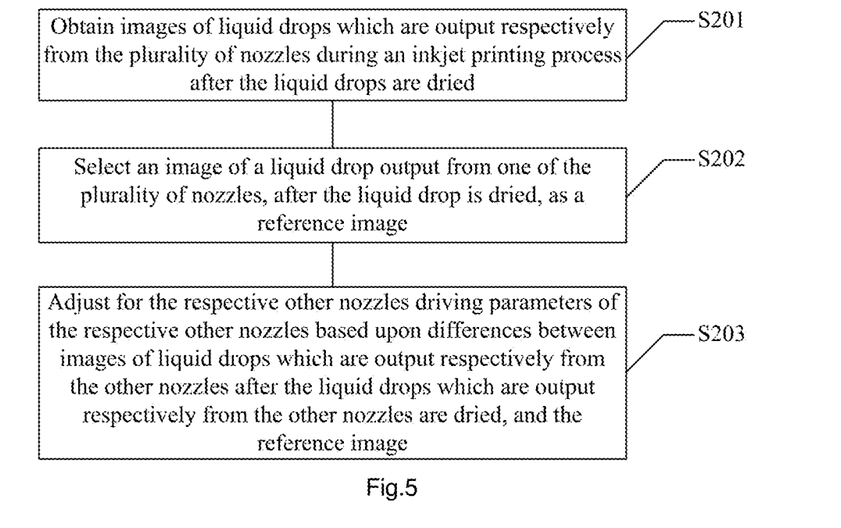
FIG. 5 is another schematic flow chart of a method for adjusting an inkjet printing apparatus according to an embodiment of the disclosure.

The operation S201 is to obtain images of liquid drops which are output respectively from the plurality of nozzles during an inkjet printing process after the liquid drops are dried.

For example, this operation can be performed in advance in a print test, for example, a same substrate as a general substrate to be used in printing is prepared, where a pixel definition layer, for example, has been prepared on the substrate; the substrate is placed below the respective nozzles of the inkjet printing apparatus at some distance from the nozzles; driving parameters (e.g., driving voltage) of the respective nozzles of the inkjet printing apparatus are adjusted to a preset value; the respective nozzles of the inkjet printing apparatus are driven to output liquid drops respectively on the substrate; a correspondence relationship between the respective nozzles, and the liquid drops generated by jetting the ink out of them; after the liquid drops are spread, the respective liquid drops are dried in the same environment, thus resulting in images of the liquid drops which are output respectively from the plurality of nozzles onto the same target print medium after the liquid drops are dried; and thereafter the images of the liquid drops which are output respectively from the respective nozzles after the liquid drops are dried are obtained, for example, using an Automatic Optical Inspection (AOI) apparatus.

The operation S202 is to select an image of a liquid drop output from one of the plurality of nozzles, after the liquid drop is dried, as a reference image.

For example, the images of the liquid drops which are output respectively from the respective nozzles after the liquid drops are dried are observed, the most approximate one of the images to a desired target image is selected as the reference image, and a driving parameter of the nozzle, out of which the ink is jetted, and printed into the image, is recorded.

The operation S203 is to adjust for the respective other nozzles driving parameters of the respective other nozzles based upon differences between images of liquid drops which are output respectively from the other nozzles after the liquid drops which are output respectively from the other nozzles are dried, and the reference image.

For example, the images of the liquid drops which are output respectively from the other nozzles after the liquid drops are dried are compared with the reference image, and the driving parameters of the respective other nozzles are adjusted referring to the driving parameter of the nozzle, out of which the reference image is printed, according to a correspondence regularity derived in the real production between a driving parameter of a nozzle, and an image generated from ink jetted out of the nozzle, so that the images generated from the liquid drops jetted out of the respective other nozzles approach gradually the selected reference image.

In the method above for adjusting an inkjet printing apparatus, the driving parameters (e.g., driving voltage, etc.) of the respective other nozzles of the inkjet printing apparatus are adjusted so that the volumes of the liquid drops jetted out of the respective nozzles are substantially the same, and further the ink jetted out of the respective nozzles is printed into a substantially same image, thus improving the uniformity of a film to be formed in inkjet printing in the real production.

Figure 6:
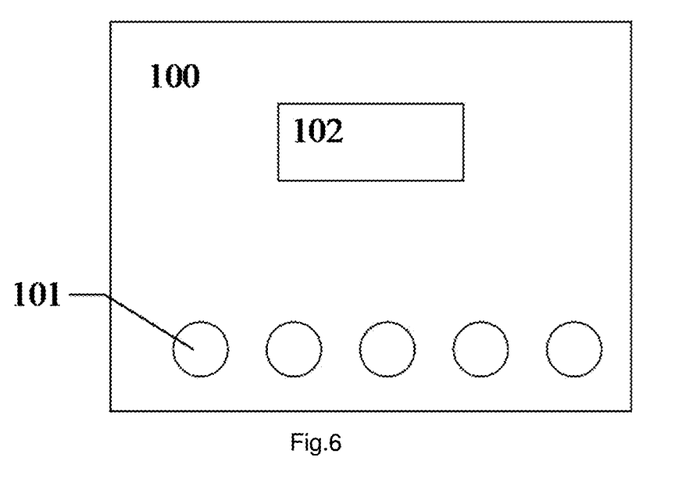
FIG. 6 is a schematic structural diagram of an inkjet printing apparatus according to an embodiment of the disclosure.

Furthermore an embodiment of the disclosure further provides an inkjet printing apparatus 100 correspondingly, as illustrated in FIG. 6, the inkjet printing apparatus 100 includes a plurality of nozzles 101 and a controller 102. Each nozzle 101 can be controlled by the controller 102 to jet a liquid drop with a preset volume out of the nozzle.

The controller 102 can be a logical processing circuit that performs logical operations, for example, the controller 102 can include at least one processor, wherein the processor includes, e.g., a Central Processing Unit (CPU), a Micro Control Unit (MCU), a Digital Signal Processor (DSP), a Field Programmable Gate Array (FPGA), a Programmable Logic Controller (PLC), etc., although the particular form of the controller 102 will not be limited thereto.

The plurality of nozzles 101 output their liquid drops with the substantially same volume during production, so when these liquid drops are jetted into the same pixel definition areas, the liquid drops are dried into substantially same images. In an embodiment of the disclosure, the controller 102 is configured to select an image of a liquid drop output from one of the plurality of nozzles 101, after the liquid drop is dried, as a reference image, and to adjust for the respective other nozzles 101 driving parameters of the respective other nozzles 101 based upon differences between images of the liquid drops which are output respectively from the other nozzles 101 after the liquid drops which are output respectively from the other nozzles 101 are dried, and the reference image.

In some embodiments, the images generated as a result of inkjet printing include mura ring images. The mura ring images are generated after the liquid drops in the respective pixel definition areas are dried, and differences between the mura ring images occur primarily due to different volumes of the liquid drops, and the differences between the mural ring images are generally reflected on the numbers of mural rings, and the sizes of the mural rings, so the differences between the volumes of the liquid drops can be estimated by observing the differences between the mural ring images. It shall be noted here that the mura ring image is an image selected in the embodiment of the disclosure for the sake of convenient observation, but may be another image selected as appropriate in another embodiment, so the embodiment of the disclosure will not be limited thereto.

In some embodiments of the disclosure, an automatic optical inspection apparatus detects the images of the liquid drops which are output from the respective nozzles 101 after the liquid drops are dried, and obtains the images of these liquid drops after the liquid drops are dried. After the reference image is selected, the images generated from the liquid drops which are output from the respective other nozzles 101 are compared with the reference image, and when errors of the respective images generated from the liquid drops which are output from the respective other nozzles 101 relative to the reference image lie in some set range, the controller 102 outputs a drive signal to enable the inkjet printing apparatus 100 to perform inkjet printing constantly; and when the error of some image relative to the reference image goes beyond the set range, the controller 102 transmits a drive signal to adjust the driving parameter of the corresponding nozzle 101 so that the image generated as a result of inkjet printing thereof is substantially the same as the reference image.

Figure 7A:
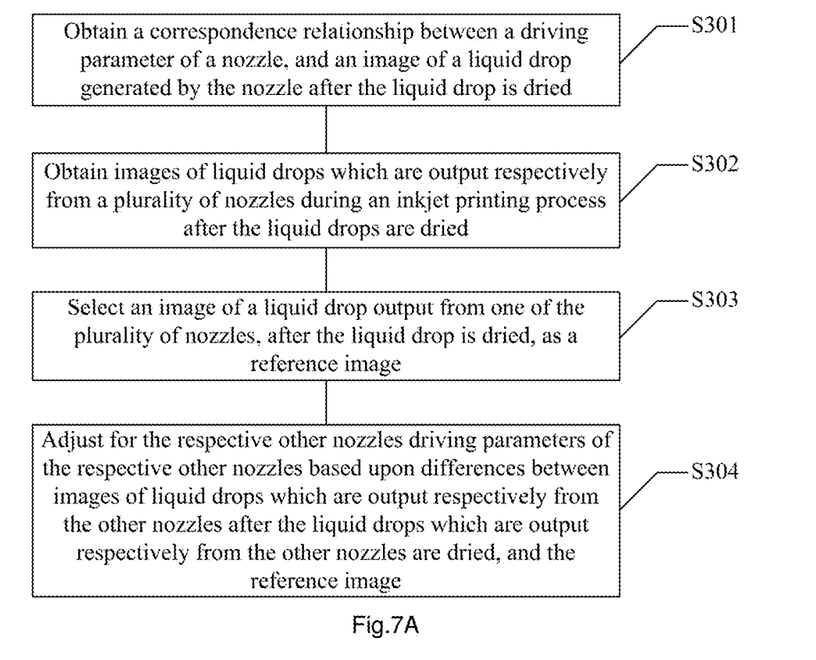
FIG. 7A is a schematic diagram of a method for adjusting an inkjet printing apparatus according to another embodiment of the disclosure.

Another embodiment of the disclosure provides a method for adjusting an inkjet printing apparatus, and as illustrated in the flow chart of FIG. 7A, the method includes the following operations S301 to S304.

The operation S301 is to obtain a correspondence relationship between a driving parameter of a nozzle, and an image of a liquid drop generated by the nozzle after the liquid drop is dried.

Taking a linear inkjet printing apparatus including piezoelectric nozzles as an example, a principle driving parameter of the inkjet printing apparatus is drive voltage. In this embodiment, the operation above can be performed in a pixel definition area of an organic light emitting diode display substrate. It shall be noted here that when the inkjet printing apparatus is embodied in another form, and the principle driving parameter thereof is varied, the obtained driving parameter of the nozzle can also be adjusted accordingly, although the embodiment of the disclosure will not be limited thereto.

Figure 7B:
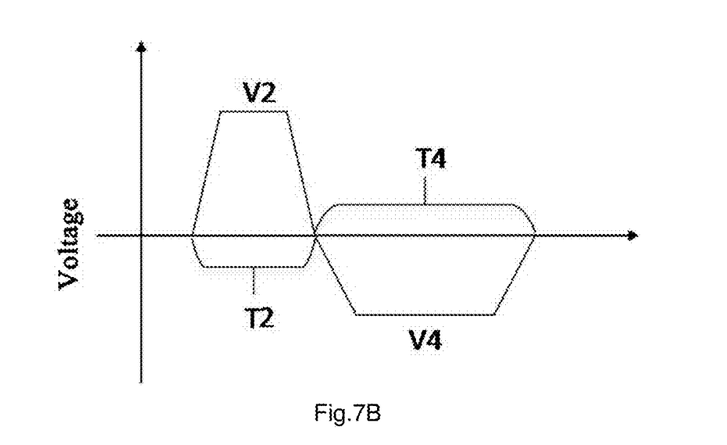
FIG. 7B is a schematic waveform diagram of voltage applied to a nozzle of an inkjet printing apparatus according to another embodiment of the disclosure.

Alike in this embodiment, the images generated as a result of inkjet printing include mura ring images. In order to obtain a correspondence relationship between a mura ring image, and the drive voltage of the inkjet printing apparatus, the method can operate, for example, as follows. For example, the inkjet printing apparatus in this embodiment is a 2.5-generation inkjet printing apparatus (e.g., Model KM256MNB), and FIG. 7B is a schematic waveform diagram of voltage applied to a nozzle of the inkjet printing apparatus, where the voltage is set as follows: V2:V4=2:1, and T2:T4=1:2, that is, the voltage V2 is twice the voltage V4, and the voltage V4 lasts for a period of time twice that of the voltage V2.

Firstly the voltage V2 is set for the inkjet printing apparatus so that there is a stable stage of the liquid drop jetted out of the nozzle; and since V2 is definitely twice V4, V4 can also be determined after V2 is determined. The length of time of T2 is varied, and also the length of time of T4 is varied accordingly thereto; and velocities (in meters per second) of the liquid drop at different T2 are measured, and a relationship between T2 and the velocity is recorded, thus resulting in a correspondence curve between T2 and the velocity in this embodiment as illustrated in FIG. 7C.

Figure 7C:
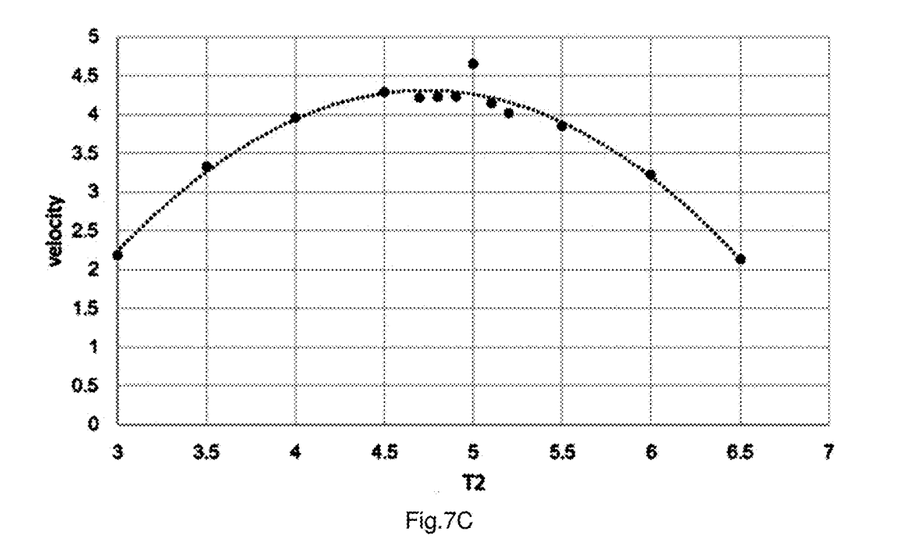
FIG. 7C is a diagram of a correspondence relationship between a duration of drive voltage of an inkjet printing apparatus and a velocity at which a liquid drop is output from a nozzle of the inkjet printing apparatus according to another embodiment of the disclosure.

A resonant point on the curve where the velocity is the maximum can be determined from FIG. 7C. As can be apparent from FIG. 7C, when the velocity is the maximum, T2=5 μs, so T4=10 μs, that is, the set values of T2 and T4 are determined. Of course, in another embodiment, T2 and T4 can also be adjusted accordingly under a real condition, and particular setting of T2 and T4 will not be limited thereto.

Figure 7D:
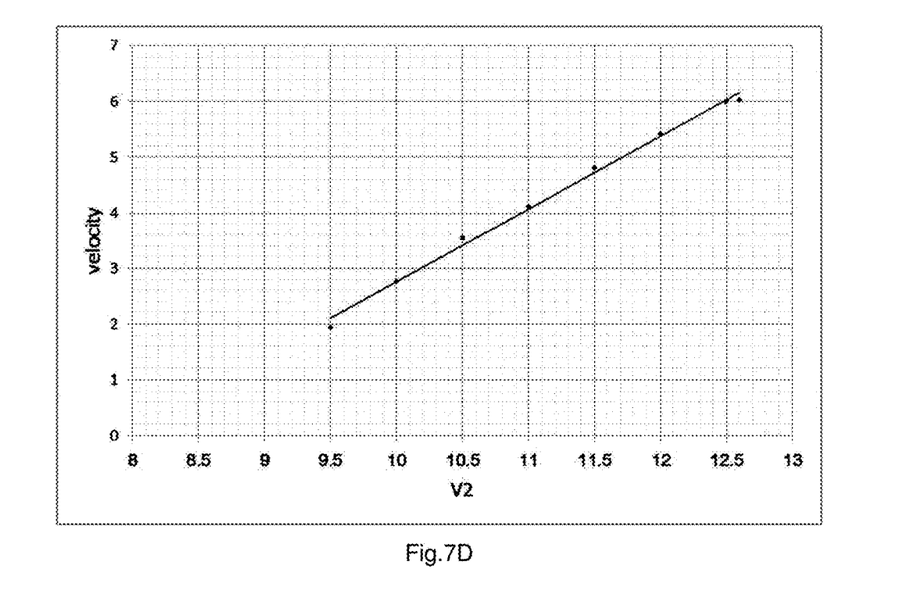
FIG. 7D is a diagram of a correspondence relationship between drive voltage of an inkjet printing apparatus and a velocity at which a liquid drop is output from a nozzle of the inkjet printing apparatus according to another embodiment of the disclosure.
Figure 7E:
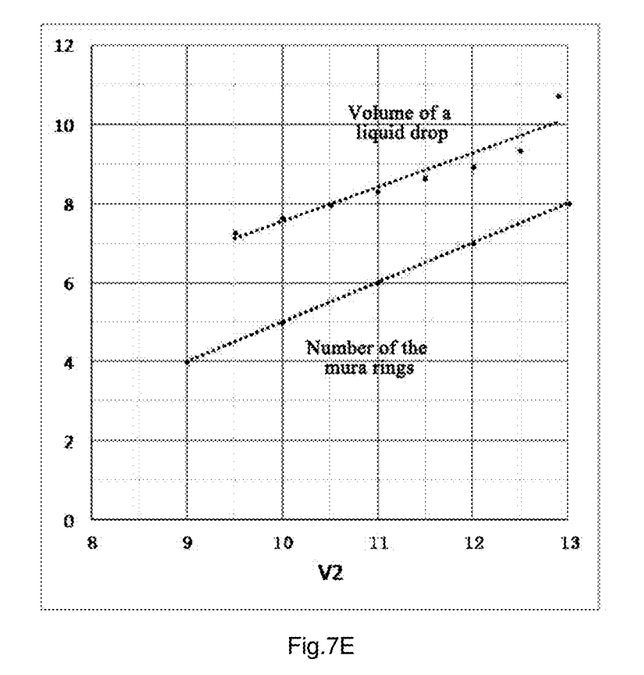
FIG. 7E is a diagram of a correspondence relationship between drive voltage of an inkjet printing apparatus, and a volume of a liquid drop output from a nozzle of the inkjet printing apparatus, and a number of mura rings according to another embodiment of the disclosure.

Some pixel definition area to be inkjet printed on the substrate is placed below a nozzle of the inkjet printing apparatus at some distance from the nozzle, the drive voltage V2 of the nozzle is adjusted to a small preset initial value, the nozzle is driven to output a liquid drop in the pixel definition area, and also the velocity at which the liquid drop is output from the nozzle at that time, and the volume of the liquid drop output from the nozzle at that time are recorded; the magnitude of the drive voltage V2 of the nozzle is incremented gradually, liquid drops are output in the pixel definition area respectively at the respective drive voltage V2, and the velocities at which the liquid drop is output from the nozzle at that time, and the volumes of the liquid drops output from the nozzle at that time are recorded, for example, when the drive voltage V2 is adjusted of 11V, V4=−5.5V is determined, so all the related parameters T2, T4, V2, and V4 of the drive voltage of the nozzle in the inkjet printing apparatus are determined, and the velocities at which the liquid drop is output from the nozzle at that time, and the volumes of the liquid drops output from the nozzle at that time are recorded; and when the drive voltage V2 of the nozzle is incremented to a preset end value, inkjet printing is stopped, thus resulting in the relationships between the velocity at which the liquid drop is output from the nozzle of the inkjet printing apparatus at the varying drive voltage V2, and the drive voltage V2, and between the volume of the output liquid drop, and the drive voltage V2. The relationship between the velocity (in meters per second) at which the liquid drop is output from the nozzle, and the drive voltage V2, and the relationship between the volume of the output liquid drop, and the drive voltage V2, both of which are derived in this embodiment are as illustrated in FIG. 7D and FIG. 7E.

After the respective liquid drops which are output from the nozzle at the respective drive voltage V2 are spread, the respective liquid drops are dried in the same way into mura ring images of the respective liquid drops after they are dried. An automatic optical inspection apparatus detects the states of the mura rings of the liquid drops after they are dried, e.g., the numbers of the mura rings, the sizes of the mura rings, etc., takes their photos, and record them to thereby create the relationship between the state of the mura rings of the liquid drops after they are dried, and the drive voltage of the nozzle of the inkjet printing apparatus, for example, in the form of a lookup table. FIG. 7E illustrates a diagram of the resulting correspondence relationship between the number of the mura rings, and the value of the drive voltage as derived in this embodiment.

The operation S302 is to obtain images of liquid drops which are output respectively from a plurality of nozzles during an inkjet printing process after the liquid drops are dried.

For example, this operation can be performed in pixel definition areas of an organic light emitting diode display substrate, where the pixel definition areas of the substrate corresponding to the respective nozzles of the inkjet printing apparatus are placed below the inkjet printing apparatus at some distance from the nozzles, drive voltage of the respective nozzles of the inkjet printing apparatus is adjusted to a preset value, the respective nozzles of the inkjet printing apparatus are driven to output liquid drops respectively in the respective pixel definition areas, a correspondence relationship between the respective nozzles, and the liquid drops generated as a result of inkjet printing thereof is recorded, and after the liquid drops are spread, the respective liquid drops are processed in the same way into the mura ring images of the liquid drops which are output respectively from the respective nozzles after the liquid drops are dried.

The operation S303 is to select an image of a liquid drop output from one of the plurality of nozzles, after the liquid drop is dried, as a reference image.

For example, the mura ring images of the liquid drops which are output respectively form the respective nozzles after the liquid drops are dried are analyzed, the most approximate one of the images to a desired target image is selected as the reference image, and the value of the drive voltage of the nozzle, out of which the ink is jetted, and printed into the image, is recorded.

The operation S304 is to adjust for the respective other nozzles driving parameters of the respective other nozzles based upon differences between images of liquid drops which are output respectively from the other nozzles after the liquid drops which are output respectively from the other nozzles are dried, and the reference image.

For example, with respect to each nozzle of the other nozzles, the mura ring image of the liquid drop which is output from the each nozzle after the liquid drop is dried is compared with the reference image above, and the drive voltage of the each nozzle is adjusted referring to the correspondence relationship obtained in the operation S301 between a driving parameter of a nozzle, and a mura ring image of a liquid drop generated by the nozzle after the liquid drop is dried (and also possibly the relationships between the velocity at which the liquid drop is output from the nozzle, and the drive voltage, and between the volume of the output liquid drop, and the drive voltage if necessary), and also the drive voltage of the nozzle, out of which the reference image is printed. Since the specifications of the respective nozzles in the same inkjet printing apparatus are substantially same, there shall be the same regularity of the correspondence relationships between the drive voltage of the respective nozzles, and the images of the liquid drops which are generated by the respective nozzles after the liquid drops are dried, the drive voltage of the other nozzles can be adjusted to thereby narrow the possible difference between the respective nozzles of the inkjet printing apparatus, so that the images generated from the liquid drops which are jetted out of the respective other nozzles approach gradually the selected reference image, so the images generated from the ink jetted from the respective nozzles are substantially the same, thus improving the uniformity of the film to be formed across the pixels, and thus improving the display quality of the resulting display device.

Figure 8:
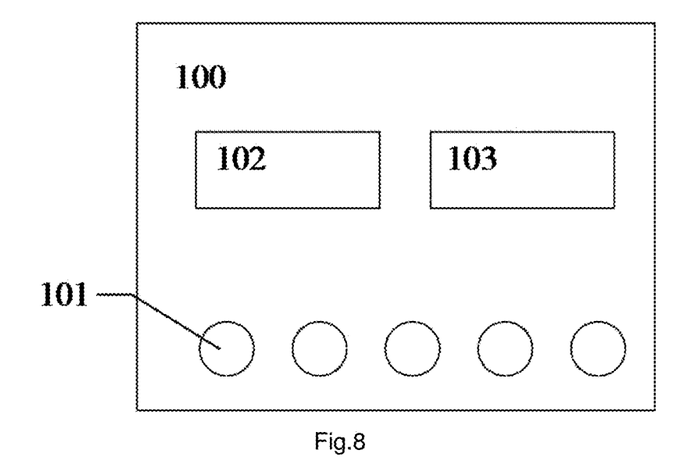
FIG. 8 is a schematic structural diagram of an inkjet printing apparatus according to another embodiment of the disclosure.

An embodiment of the disclosure further provides an inkjet printing apparatus as illustrated in FIG. 8, where the inkjet printing apparatus 100 includes a plurality of nozzles 101, a controller 102, and a memory 103. Each nozzle can be controlled by the controller 102 to jet a liquid drop with a preset volume.

The controller 102 can be a logical processing circuit that performs logical operations, for example, the controller 102 can include at least one processor, wherein the processor includes, e.g., a Central Processing Unit (CPU), a Micro Control Unit (MCU), a Digital Signal Processor (DSP), a Field Programmable Gate Array (FPGA), a Programmable Logic Controller (PLC), etc., although the particular form of the controller 102 will not be limited thereto.

The memory 103, connected to the controller 102 via a communication link, including any combination of one or more computer program products, the computer program products can include various forms of computer readable storage medium, such as a volatile memory and/or a non-volatile memory. The volatile memory for example can include a random access memory (RAM) and/or a cache memory (cache), etc. The nonvolatile memory for example can include a read-only memory (ROM), a hard disk, an Electrically Programmable Read-Only-Memory (EPROM), portable compact type read-only memory (CD-ROM), a USB memory, a flash memory, etc. One or more computer instructions can be stored in the memory 103, and the controller 102 can be configured to execute the computer instructions to realize various functions. Further a variety of applications and data can also be stored in the computer readable storage medium.

Connected via a communication link refers to, for example, performing data communication through any combination of a wireless network, a cable network, and/or a wireless network and a cable network. A network can include local area network, Internet, telecommunication network, Internet of Things based on the internet and/or the telecommunication network, and/or any combination of the above networks, etc. The cable network can communicate via a communication mode such as a wire, a twisted pair, a coaxial cable, or an optical fiber, etc., the wireless network can communicate via a communication mode such as a mobile communication network, Bluetooth, ZigBee or Wi-Fi, etc.

In some embodiments of the disclosure, the plurality of nozzles 101 have substantially the same specification; when the volumes of liquid drops output during production are the same, substantially same images are generated after the liquid drops are dried. The memory 103 can store a correspondence relationship between a driving parameter of a nozzle 101, and an image of a liquid drop generated from the nozzle after the liquid drop is dried; and the controller 102 is configured to select an image of a liquid drop output from one of the plurality of nozzles, after the liquid drop is dried, as a reference image, and to adjust driving parameters of the respective other nozzles 101 based upon differences between images of liquid drops which are output from the respective other nozzles 101 after the liquid drops which are output from the respective other nozzles 101 are dried, and the reference image, according to the correspondence relationship, so that mages of liquid drops which are output respectively from the plurality of nozzles 101, after the liquid drops which are output respectively from the plurality of nozzles 101 are dried, are substantially the same.

In some embodiments, the inkjet printing apparatus 100 is configured to perform inkjet printing in pixel definition areas of an organic light emitting diode display substrate to form pixel images. For example, the inkjet printing 100 exemplified in this embodiment is a linear inkjet printing apparatus with a principle driving parameter of drive voltage, and an image of a liquid drop generated from ink jetted out of a nozzle after the liquid drop is dried is a mura ring image.

In this embodiment, an automatic optical inspection apparatus detects the mura ring images of the liquid drops which are output from the respective nozzles after the liquid drops are dried, at a detection frequency which can be set as needed. In an example of this embodiment, the automatic optical inspection apparatus can detect the mura ring images during an inkjet printing process, that is, detect the printed image of the pixels in-situ during production, and then adjust the driving parameter to be applied to a next print area (e.g., one or more subsequent rows or columns, etc.) according to a detection result.

After a mura ring image generated from a liquid drop output from a nozzle 101 of the inkjet printing apparatus 100 is selected as the reference image, the controller 102 will compare mura ring images generated from liquid drops which are output from the respective other nozzles 101, with the reference image, and when errors of the respective mura ring images relative to the reference image lie in some set range, the inkjet printing apparatus 100 performs inkjet printing constantly; and when the error of some mura ring image, generated from inkjet printing, relative to the reference image goes beyond the set range, the controller 102 transmits a drive signal to adjust the driving parameter of the corresponding nozzle 101 so that the image generated as a result of inkjet printing thereof is substantially the same as the reference image.

The controller 102 adjusts the drive voltage of the respective other nozzles 101 according to the correspondence relationship stored in the memory 103 between the drive voltage of a nozzle 101, and the image of a liquid drop generated from the nozzle after the liquid drop is dried, and the differences between the images generated from the liquid drop output from the respective other nozzles, and the reference image. Since the specifications of the respective nozzles 101 in the inkjet printing apparatus 100 are substantially the same, there shall be the same regularity of the correspondence relationships between the drive voltage of the respective nozzles 101, and the images of the liquid drops which are generated respectively by the nozzles after the liquid drops are dried. In an example of this embodiment, an automatic optical detection apparatus detects the mura ring images in real time, so the controller 102 also adjusts the drive voltage in real time.

The controller 102 can adjust the drive voltage accurately and rapidly according to the correspondence relationship stored in the memory 103 between the drive voltage of a nozzle 101, and the image of the liquid drop generated from the nozzle after the liquid drop is dried, so that the images generated from the ink jetted from the respective nozzles 101 are substantially the same.

Figure 9:
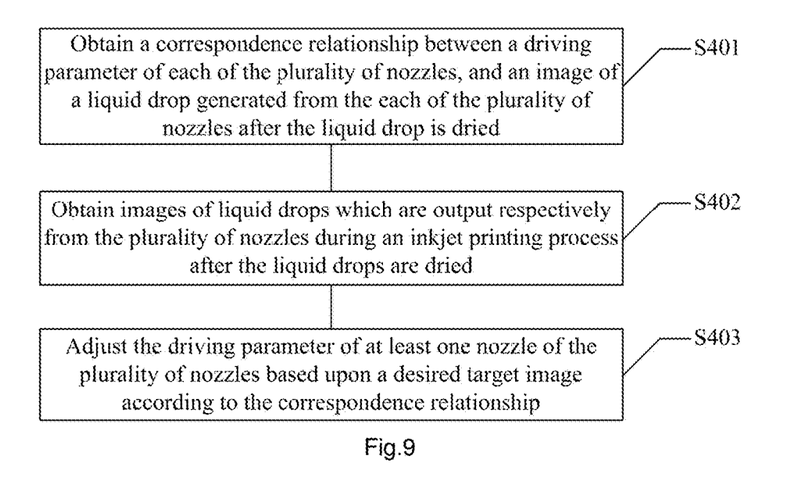
FIG. 9 is a schematic flow chart of a method for adjusting an inkjet printing apparatus according to still another embodiment of the disclosure.

In some embodiments, when the specifications of respective nozzles in an inkjet printing apparatus may significantly different from each other, alternatively the following method for adjusting an inkjet printing apparatus according to this embodiment can be applied, and as illustrated in the flow chart of FIG. 9, the method includes the following operations.

The operation S401 is to obtain a correspondence relationship between a driving parameter of each of the plurality of nozzles, and an image of a liquid drop generated from the each of the plurality of nozzles after the liquid drop is dried.

Taking a linear inkjet printing apparatus as an example, a principle driving parameter of the inkjet printing apparatus is drive voltage. The operation above can be performed in a pixel definition area of an organic light emitting diode display substrate. Alike, when the inkjet printing apparatus is embodied in another form, and the principle driving parameter thereof is varied, the obtained driving parameter of the nozzle can also be adjusted accordingly, although the embodiment of the disclosure will not be limited thereto.

In this embodiment of the disclosure, firstly the pixel definition areas for inkjet printing on the substrate are made corresponding to the respective nozzles of the inkjet printing apparatus, and placed below the inkjet printing apparatus at some distance from the nozzles, drive voltage of the respective nozzles is adjusted to a small preset initial value, the respective nozzles are driven to output liquid drops respectively in the respective pixel definition areas, the drive voltage of the respective nozzles is incremented gradually, the respective nozzles are driven to output liquid drops respectively in the respective pixel definition areas, and when the drive voltage of the respective nozzles is incremented to a preset end value, inkjet printing is stopped. The drive voltage of the inkjet printing apparatus can be adjusted particularly as in the previous embodiment, so a repeated description thereof will be omitted here. After the respective liquid drops are spread, the respective liquid drops are dried in the same way into an inkjet printing image including images of the liquid drops which are output respectively form the plurality of nozzles on the same target print medium at the different drive voltage after the liquid drops are dried, where the images include mura ring images in this embodiment. The correspondence relationships between the mura ring images of the respective liquid drops which are output from the respective nozzles at the different driving voltage after the liquid drops are dried, the respective nozzles, and their corresponding drive voltage are recorded and stored.

The operation S402 is to obtain images of liquid drops which are output respectively from the plurality of nozzles during an inkjet printing process after the liquid drops are dried.

In some embodiments, this operation can be performed in the pixel definition areas of the organic light emitting diode display substrate, where the pixel definition areas on the substrate corresponding to the respective nozzles of the inkjet printing apparatus are placed below the inkjet printing apparatus at some distance from the nozzles, drive voltage of the respective nozzles of the inkjet printing apparatus is adjusted to a preset value, the respective nozzles of the inkjet printing apparatus are driven to output liquid drops respectively in the pixel definition areas, correspondence relationships between the respective nozzles, and the liquid drops generated as a result of inkjet printing thereof are recorded, and after the liquid drops are spread, the respective liquid drops are processed in the same way into the images of the liquid drops which are output respectively form the respective nozzles after the liquid drops are dried.

The operation S403 is to adjust the driving parameter of at least one nozzle of the plurality of nozzles based upon a desired target image according to the correspondence relationship.

Since the correspondence relationship between the drive voltage of each of the plurality of nozzles, and the image of the liquid drop generated from the each of the plurality of nozzles after the liquid drop is dried, has been obtained in the operation S401, a target image can be selected, for example, which may be an image of a liquid drop output from some nozzle during an inkjet printing process after the liquid drop is dried, or any image selected as needed in reality, although the selected target image will not be limited thereto. Then the most approximate image to the target image, and the value of the drive voltage corresponding thereto are found according to the correspondence relationships between the drive voltage of the respective nozzles, and the images of the liquid drops generated from the nozzles after the liquid drops are dried, and the drive voltage of the corresponding nozzles is adjusted, so that the images of the liquid drops which are output from the respective nozzles as a result of inkjet printing, after the liquid drops are dried, are substantially the same.

An embodiment of the disclosure further provides an inkjet printing apparatus 100 as illustrated in FIG. 8, where the inkjet printing apparatus 100 includes a plurality of nozzles 101, a controller 102, and a memory 103. The controller 102, connected to the memory 103 via a communication link. Each nozzle 101 can be controlled by the controller 102 to jet a liquid drop with a preset volume out of the nozzle.

The controller 102 can be a logical processing circuit that performs logical operations, for example, the controller 102 can include at least one processor, wherein the processor includes, e.g., a Central Processing Unit (CPU), a Micro Control Unit (MCU), a Digital Signal Processor (DSP), a Field Programmable Gate Array (FPGA), a Programmable Logic Controller (PLC), etc., although the particular form of the controller 102 will not be limited thereto.

The memory 103 includes any combination of one or more computer program products, the computer program products can include various forms of computer readable storage medium, such as a volatile memory and/or a non-volatile memory. The volatile memory for example can include a random access memory (RAM) and/or a cache memory (cache), etc. The nonvolatile memory for example can include a read-only memory (ROM), a hard disk, an Electrically Programmable Read-Only-Memory (EPROM), portable compact type read-only memory (CD-ROM), a USB memory, a flash memory, etc. One or more computer instructions can be stored in the memory 103, and the controller 102 can be configured to execute the computer instructions to realize various functions. Further a variety of applications and data can also be stored in the computer readable storage medium.

Connected via a communication link refers to, for example, performing data communication through any combination of a wireless network, a cable network, and/or a wireless network and a cable network. A network can include local area network, Internet, telecommunication network, Internet of Things based on the internet and/or the telecommunication network, and/or any combination of the above networks, etc. The cable network can communicate via a communication mode such as a wire, a twisted pair, a coaxial cable, or an optical fiber, etc., the wireless network can communicate via a communication mode such as a mobile communication network, bluetooth, ZigBee or Wi-Fi, etc.

The plurality of nozzles 101 may have different specifications due to a manufacturing process or another reason, and with the method according to this embodiment, when the volumes of liquid drops output during production are the same, substantially same images are generated after the liquid drops are dried. The memory 103 can store a correspondence relationship between a driving parameter of each of the plurality of nozzles 101, and an image of a liquid drop generated from the each of the plurality of nozzles 101 after the liquid drop is dried; and the controller 102 is configured to adjust the driving parameter of at least one nozzle 101 based upon the desired target image according to the correspondence relationship, so that the images of the liquid drops which are output respectively from the plurality of nozzles 101, after the liquid drops are dried, are substantially the same.

In some embodiments, the inkjet printing apparatus 100 is configured to perform inkjet printing in the pixel definition areas of the organic light emitting diode display substrate to form pixel images. For example, the inkjet printing 100 exemplified in this embodiment is a linear inkjet printing apparatus with a principle driving parameter of drive voltage, and an image of a liquid drop generated from ink jetted out of a nozzle 101 after the liquid drop is dried is a mura ring image.

In this embodiment of the disclosure, an automatic optical inspection apparatus detects the mura ring images of the liquid drops which are output from the respective nozzles 101 after the liquid drops are dried. In this embodiment, the automatic optical inspection apparatus detects the mura ring images generated from the liquid drops which are output from the respective nozzles 101 of the inkjet printing apparatus 100, and compares them with the target image. When errors of the respective mura ring images relative to the reference image lie in some set range, the inkjet printing apparatus 100 performs inkjet printing constantly; and when the error of some mura ring image, generated from inkjet printing, relative to the target image goes beyond the set range, the controller transmits a drive signal to adjust the driving parameter of the corresponding nozzle 101 so that the image generated as a result of inkjet printing thereof is substantially the same as the target image.

Since the memory 103 stores the correspondence relationships between the drive voltage of the respective nozzles 101, and the images of the liquid drops generated from the respective nozzles after the liquid drops are dried, the controller 102 can find the correspondence relationship stored in the memory 103 between the drive voltage of a nozzle 101 from which an unqualified image is generated, and the image of the liquid drop generated from the nozzle after the liquid drop is dried, so that the controller 102 can further adjusts the drive voltage of the nozzle 101 according to the correspondence relationship, and the difference between the unqualified image and the target image, so that the images generated from the ink jetted from the respective nozzles 101 are substantially the same as the target image.

In some embodiments of the disclosure, the automatic optical detection apparatus can detect in real time the mura ring images generated from the liquid drops which are output from the respective nozzles 101 of the inkjet printing apparatus 100, and also the controller 102 can adjust the drive voltage in real time, so the inkjet printing apparatus 100 can enable the images of the liquid drops which are output from the respective nozzles 101 thereof, after the liquid drops are dried, to remain substantially the same during an inkjet printing process to thereby improve the uniformity of the film to be formed in inkjet printing.

In this embodiment, the memory 103 stores the correspondence relationship between the driving parameter of each of the plurality of nozzles 101, and the image of the liquid drop generated from the each of the plurality of nozzles 101 after the liquid drop is dried, so a target image can be selected, as needed in the inkjet printing process, for subsequent inkjet printing, where the target image may be an image generated from some nozzle 101 of the inkjet printing apparatus 100, or may be some target image selected as appropriate, thus making the inkjet printing process more convenient and efficient.

Figure 10:
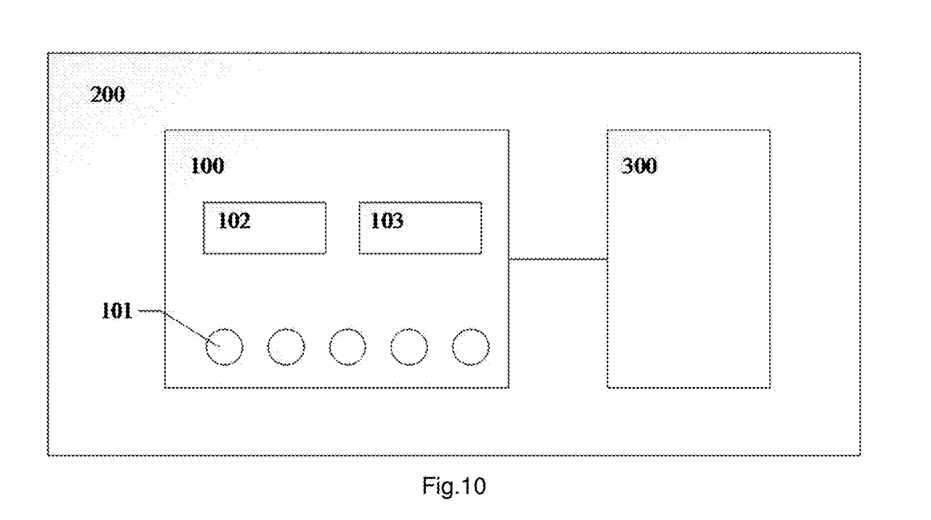
FIG. 10 is a schematic structural diagram of an inkjet printing system according to an embodiment of the disclosure.

An embodiment of the disclosure further provides an inkjet printing system as illustrated in FIG. 10, where the inkjet printing system 200 includes the inkjet printing apparatus 100 according to any one of the embodiments above of the disclosure, and an automatic optical detection apparatus 300. The inkjet printing apparatus 100 is configured to perform inkjet printing; and the plurality of nozzles 101 of the inkjet printing apparatus 100 output liquid drops, and images are generated after the liquid drops are dried.

The automatic optical detection apparatus 300 is configured to detect the images of the liquid drops which are output respectively from the plurality of nozzles 101 of the inkjet printing apparatus 100 after the liquid drops are dried. The automatic optical detection apparatus 300 can detect the images at a detection frequency which can be set as needed in reality, or in real time.

Reference can be made to the description above for the particular implementation of the inkjet printing system 200, so a repeated description thereof will be omitted here.

An embodiment of the disclosure further provides an inkjet printing method including: adjusting an inkjet printing apparatus using the method for adjusting an inkjet printing apparatus according to any one of the embodiments of the disclosure, and performing inkjet printing using the inkjet printing apparatus. With this inkjet printing method, the volumes of liquid drops jetted out of respective nozzles of the inkjet printing apparatus can be substantially the same, so that images of the liquid drops jetted out of the respective nozzles after the liquid drops are dried are also substantially the same, thus improving the uniformity of a film to be formed in inkjet printing. Furthermore a correspondence relationship between a driving parameter of a nozzle, and an image of a liquid drop generated from the nozzle after the liquid drop is dried is created, and a correspondence regularity between the image and the driving parameter is found, so that the driving parameters of the respective nozzles can be adjusted more conveniently and efficiently under a real production condition to perform inkjet printing.

Furthermore this inkjet printing method can be applicable to manufacturing of a display substrate, e.g., an organic light emitting diode display substrate, or a color filter substrate, e.g., a liquid crystal display device, or another type of display substrate, e.g., a quantum dot display substrate, etc.; and at this time, the liquid output from the nozzles of the inkjet printing apparatus is a material for forming an organic functional layer of an organic light emitting diode, where for example, the material can be a material for forming a light emitting layer, a hole transmission layer, a hole injection layer, an electron transmission layer, an electron injection layer, etc., and for example, the material can be firstly dissolved in organic solvent, thus resulting in "ink" for inkjet printing. Alternatively the liquid output from the nozzles of the inkjet printing apparatus is a material for forming a color filter sheet, e.g., an epoxy resin mixed with a dye (i.e. a colorant), where the material can also be firstly dissolved in organic solvent, thus resulting in "ink" for inkjet printing. Thus when the inkjet printing method above is applicable to manufacturing of a display substrate, there is an even film formed across a substantially uniform pixel images generated from the liquid drops which are output from the respective nozzles of the inkjet printing apparatus in pixel definition areas, so the display quality of the display can be improved.

A method for adjusting an inkjet printing apparatus, an inkjet printing method, an inkjet printing apparatus, and a system including the same according to at least one embodiments of the disclosure have at least one of the following advantageous effects.

1. In the method for adjusting an inkjet printing apparatus according to an embodiment of the disclosure, the driving parameter of at least one nozzle of the plurality of nozzles is adjusted according to the images of the liquid drops which are output respectively from the plurality of nozzles after the liquid drops are dried, so that the volumes of the liquid drops which are output from the respective nozzles are substantially the same, and furthermore the images of the liquid drops which are output from the respective nozzles after the liquid drops are dried are also substantially the same, thus improving the evenness of the film to be formed in inkjet printing.

2. In the method for adjusting an inkjet printing apparatus according to an embodiment of the disclosure, the correspondence relationships between the driving parameters of the nozzles, and the images of the liquid drops which are generated from the nozzles after the liquid drops are dried are created, and the correspondence regularities between the images and the driving parameters, so that the driving parameters of the respective nozzles can be adjusted more accurately, conveniently, and efficiently under a real production condition.

3. In the inkjet printing apparatus according to an embodiment of the disclosure, the driving parameter of at least one nozzle of the plurality of nozzles is adjusted in real time according to the images of the liquid drops which are output respectively from the plurality of nozzles, after the liquid drops are dried, in the liquid drop process, so that the volumes of the liquid drops which are jetted out of the respective nozzles are substantially the same, and furthermore the images of the liquid drops which are output from the respective nozzles after the liquid drops are dried are also substantially the same, thus improving the evenness of the film to be formed in inkjet printing.

3. In the inkjet printing apparatus according to an embodiment of the disclosure, the correspondence relationships between the driving parameters of the respective nozzles, and the images of the liquid drops which are generated from the respective nozzles after the liquid drops are dried are recorded, so that the driving parameters of the respective nozzles can be adjusted more conveniently and efficiently under a real production condition.

It shall be noted that: (1) The drawings in the embodiments of the disclosure merely refer to the structural components as referred to in the embodiments of the disclosure, and reference can be made to typical structural designs of the other components.

(2) For the sake of clarity, the thickness of a layer or an area has been enlarged or narrowed in the drawings to which reference is made for the description of the embodiments of the disclosure, that is, the drawings may not be drawn to scale.

(3) The respective embodiments of the disclosure, and the respective features in the embodiments can be combined with each other into other embodiments unless they conflict with each other.

The foregoing disclosure is merely illustrative of the particular embodiments of the disclosure, but the scope of the disclosure as claimed will not be limited thereto, and any other variations or alternatives which can readily occur to those skilled in the art without departing from the technical solution of the disclosure of the disclosure shall fall into the scope of the disclosure as claimed. Accordingly the scope of the disclosure as claimed shall be as defined in the appended claims.

The invention claimed is:

1. A method for adjusting an inkjet printing apparatus comprising a plurality of nozzles, the method comprising:
dropping liquid drops from the plurality of nozzles during an inkjet printing process;
landing the liquid drops into respective identical pixel definition areas formed at a pixel definition layer on a substrate;
drying, after the liquid drops are spread in the respective identical pixel definition areas, the liquid drops on the substrate in the same environment to a state such that images of the liquid drops after the liquid drops are dried are substantially permanent;
obtaining the images of the liquid drops after the liquid drops are dried; and
adjusting a driving parameter of at least one nozzle of the plurality of nozzles based upon the images of the liquid drops which are output respectively from the plurality of nozzles after the liquid drops are dried, so that volumes of the liquid drops which are output respectively from the plurality of nozzles are substantially same.

2. The method for adjusting an inkjet printing apparatus according to claim 1, further comprising:
selecting an image of a liquid drop output from one of the plurality of nozzles, after the liquid drop is dried, as a reference image; and
adjusting for respective other nozzles driving parameters of the respective other nozzles based upon differences between images of liquid drops which are output respectively from the other nozzles after the liquid drops which are output respectively from the other nozzles are dried, and the reference image.

3. The method for adjusting an inkjet printing apparatus according to claim 2, further comprising:
obtaining a correspondence relationship between a driving parameter of the one of the plurality of nozzles, and the image of the liquid drop output from the one of the plurality of nozzles after the liquid drop is dried; and
adjusting driving parameters of the respective other nozzles based upon the differences between the images of the liquid drops which are output respectively from the other nozzles after the liquid drops which are output respectively from the other nozzles are dried, and the reference image, according to the correspondence relationship, so that the images of the liquid drops which are output respectively from the plurality of nozzles, after the liquid drops are dried, are substantially same.

4. The method for adjusting an inkjet printing apparatus according to claim 1, further comprising:
obtaining a correspondence relationship between a driving parameter of each of the plurality of nozzles, and an image of a liquid drop generated by the each of the plurality of nozzles after the liquid drop is dried; and
adjusting a driving parameter of at least one nozzle of the plurality of nozzles based upon a desired target image according to the correspondence relationship, so that the images of the liquid drops which are output respectively from the plurality of nozzles, after the liquid drops are dried, are substantially same.

5. The method for adjusting an inkjet printing apparatus according to claim 1, wherein the images of the liquid drops which are output respectively from the plurality of nozzles, after the liquid drops are dried, are detected in real time, and driving parameters of the plurality of nozzles are adjusted in real time, during an inkjet printing process.

6. The method for adjusting an inkjet printing apparatus according to claim 1, wherein the images are mura ring images.

7. The method for adjusting an inkjet printing apparatus according to claim 1, wherein the driving parameter is driving voltage.

8. An inkjet printing method, comprising:
adjusting an inkjet printing apparatus using the method for adjusting an inkjet printing apparatus according to claim 1, and performing inkjet printing using the inkjet printing apparatus.

9. An inkjet printing apparatus, comprising:
a plurality of nozzles configured to drop liquid drops during an inkjet printing process, and to land the liquid drops into respective identical pixel definition areas formed at a pixel definition layer on a substrate; and
a controller configured to obtain images of the liquid drops after the liquid drops are spread in the respective identical pixel definition areas and are subsequently dried on the substrate in the same environment to a state such that the images of the liquid drops after the liquid drops are dried are substantially permanent, and to adjust a driving parameter of at least one nozzle of the plurality of nozzles based upon the images of the liquid drops which are output respectively from the plurality of nozzles after the liquid drops are dried, so that volumes of the liquid drops which are output respectively from the plurality of nozzles are substantially same.

10. The inkjet printing apparatus according to claim 9, wherein:
the controller is configured to select an image of a liquid drop output from one of the plurality of nozzles, after the liquid drop is dried, as a reference image, and to adjust for respective other nozzles driving parameters of the respective other nozzles based upon differences between images of liquid drops which are output respectively from the other nozzles after the liquid drops which are output respectively from the other nozzles are dried, and the reference image.

11. The inkjet printing apparatus according to claim 9, wherein the inkjet printing apparatus further comprises:
a memory, connected with the controller via a communication link, and configured to store a correspondence relationship between a driving parameter of the one of the plurality of nozzles, and the image of the liquid drop output from the one of the plurality of nozzles after the liquid drop is dried; and wherein the controller is configured to adjust driving parameters of the respective other nozzles based upon the differences between the images of the liquid drops which are output respectively from the other nozzles after the liquid drops which are output respectively from the other nozzles are dried, and the reference image, according to the correspondence relationship, so that the images of the liquid drops which are output respectively from the plurality of nozzles, after the liquid drops are dried, are substantially same.

12. The inkjet printing apparatus according to claim 9, wherein the inkjet printing apparatus further comprises:

a memory configured to store a correspondence relationship between a driving parameter of each of the plurality of nozzles, and an image of a liquid drop generated by the each of the plurality of nozzles after the liquid drop is dried; and wherein the controller is configured to adjust a driving parameter of at least one nozzle of the plurality of nozzles based upon a desired target image according to the correspondence relationship, so that the images of the liquid drops which are output respectively from the plurality of nozzles, after the liquid drops are dried, are substantially same.

13. An inkjet printing system, comprising:

the inkjet printing apparatus according to claim 9; and an automatic optical inspection apparatus configured to detect the images of the liquid drops which are output respectively from the plurality of nozzles of the inkjet printing apparatus after the liquid drops are dried.

14. The inkjet printing system according to claim 13, wherein:

the automatic optical inspection apparatus is configured to detect in real time the images of the liquid drops which are output respectively from the plurality of nozzles of the inkjet printing apparatus after the liquid drops are dried; and the inkjet printing apparatus is configured to adjust in real time a driving parameter of a nozzle according to a desired target image.

15. A method for manufacturing a display substrate, the method comprising:

forming a pixel image on a base substrate using the inkjet printing method according to claim 8.

* * * * *